United States Patent
Poodt et al.

(10) Patent No.: US 10,428,423 B2
(45) Date of Patent: Oct. 1, 2019

(54) METHOD AND APPARATUS FOR DEPOSITING ATOMIC LAYERS ON A SUBSTRATE

(71) Applicant: NEDERLANDSE ORGANISATIE VOOR TOEGEPAST-NATUURWETEN SCHAPPELIJK ONDERZOEK TNO, 's-Gravenhage (NL)

(72) Inventors: Paulus Willibrordus George Poodt, 's-Gravenhage (NL); Raymond Jacobus Wilhelmus Knaapen, 's-Gravenhage (NL)

(73) Assignee: Nederlandse Organisatie voor toegepast-natuurwetenschappelijk onderzoek TNO, 's-Gravenhage (NL)

(*) Notice: Subject to any disclaimer, the term of this patent is extended or adjusted under 35 U.S.C. 154(b) by 148 days.

(21) Appl. No.: 15/320,424

(22) PCT Filed: Jun. 19, 2015

(86) PCT No.: PCT/NL2015/050452
§ 371 (c)(1),
(2) Date: Dec. 20, 2016

(87) PCT Pub. No.: WO2015/194959
PCT Pub. Date: Dec. 23, 2015

(65) Prior Publication Data
US 2017/0191158 A1    Jul. 6, 2017

(30) Foreign Application Priority Data
Jun. 20, 2014   (EP) ..................................... 14173327

(51) Int. Cl.
*C23C 16/455*   (2006.01)
*C23C 16/458*   (2006.01)
(Continued)

(52) U.S. Cl.
CPC ...... *C23C 16/45544* (2013.01); *C23C 16/455* (2013.01); *C23C 16/458* (2013.01);
(Continued)

(58) Field of Classification Search
None
See application file for complete search history.

(56) References Cited

U.S. PATENT DOCUMENTS

2012/0003396 A1   1/2012   Maas et al.
2013/0064977 A1   3/2013   Vermeer et al.

FOREIGN PATENT DOCUMENTS

CN   103874783 A   6/2014
EP   2557198 A1    2/2013
(Continued)

OTHER PUBLICATIONS

The State Intellectual Property Office of the People's Republic of China, Office Action in corresponding Chinese Application No. 2015800446369, dated Aug. 3, 2018 (16 pages).
(Continued)

*Primary Examiner* — Joel G Horning
(74) *Attorney, Agent, or Firm* — Leydig, Voit & Mayer, Ltd.

(57) ABSTRACT

A method of depositing an atomic layer on a substrate comprises supplying a precursor gas from a precursor-gas supply comprised in a drum; the drum being rotatable with respect to a sealing piece that receives gas from a gas source. One of the drum or sealing piece comprising one or more gas feed channels in fluid connection with the precursor-gas supply and the other of the drum or sealing piece comprises one or more circumferential grooves in its surface sealed by the one of the drum or sealing piece thereby preventing a fluid flowpath in radial direction and leaving a fluid flow path in circumferential direction. At least one sealed groove
(Continued)

is provided with one or more separations separating adjacent zones of process gas feeds in the sealed groove, thus allowing zones to provide for mutually differing process gas compositions to have the precursor gas react near, e.g. on, the substrate thus depositing a stack of atomic layers of a gradient composition.

11 Claims, 6 Drawing Sheets

(51) Int. Cl.
　　*H01L 51/00* (2006.01)
　　*H01L 51/56* (2006.01)
(52) U.S. Cl.
　　CPC .. *C23C 16/45525* (2013.01); *C23C 16/45529* (2013.01); *C23C 16/45551* (2013.01); *C23C 16/45563* (2013.01); *H01L 51/0021* (2013.01); *H01L 51/56* (2013.01)

(56) References Cited

FOREIGN PATENT DOCUMENTS

| | | |
|---|---|---|
| JP | 2007-063096 A | 3/2007 |
| WO | WO 2010/024671 A1 | 3/2010 |
| WO | WO 2011/041255 A1 | 4/2011 |
| WO | WO 2013/022339 A1 | 2/2013 |

OTHER PUBLICATIONS

European Patent Office, International Search Report in International Application No. PCT/NL2015/050452 dated Aug. 10, 2015.

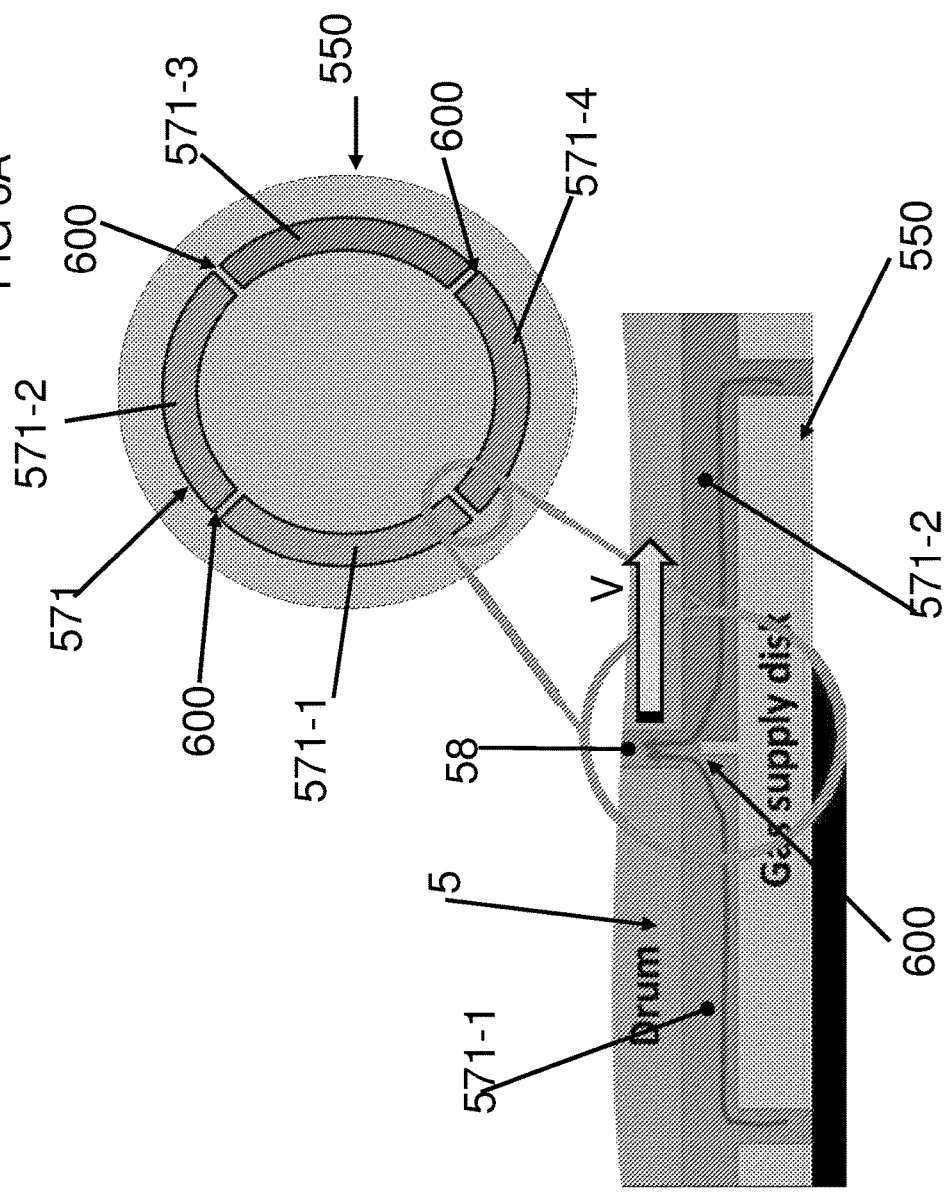

METHOD AND APPARATUS FOR DEPOSITING ATOMIC LAYERS ON A SUBSTRATE

CROSS-REFERENCE TO RELATED APPLICATIONS

This patent application is a U.S. National Phase of PCT International Application No. PCT-NL2015/050452, filed Jun. 19, 2015, which claims priority to European Patent Application No. 14173327.9, filed Jun. 20, 2014, the contents of which are expressly incorporated herein by reference in there entireties, including any references therein.

TECHNOLOGY FIELD

The invention relates to a method of depositing an atomic layer, preferably a stack of atomic layers, on a substrate, which method comprises supplying a precursor gas from a precursor-gas supply comprised by a deposition head towards the substrate. The invention also relates to an apparatus for depositing an atomic layer on a substrate, the apparatus comprising a deposition head having a precursor-gas supply for supplying a precursor gas towards the substrate.

BACKGROUND

Atomic layer deposition is known as a method for depositing a monolayer of target material. Atomic layer deposition differs from for example chemical vapor deposition in that atomic layer deposition takes at least two consecutive process steps (i.e. half-cycles). A first one of these self-limited process steps comprises application of a precursor gas on a substrate's surface. A second one of these self-limited process steps comprises reaction of the precursor material in order to form the monolayer of target material. Atomic layer deposition has the advantage of enabling excellent if not ideal layer thickness control. However, atomic layers are essentially thin. As a result, application of atomic layer deposition for depositing layers with a certain thickness larger than about 10 nanometers usually is rather time-consuming, because numerous atomic layers need to be stacked for obtaining such a layer thickness.

In the known roll-to-roll solutions for instance of the type disclosed in WO2103022339 it is not possible to deposit films with a composition gradient in thickness direction, while that would be highly desired in terms of optimizing electrical-, optical and interfacial properties of these films when integrated into a device. For example, it is known that gradient films can be provided by growing multicomponent oxides deposited by spatial atmospheric atomic layer deposition in a prescribed mixing ratio. For example, AlxZn1-xO films can be deposited by using diethyl zinc (DEZ), trimethyl aluminum (TMA) and water as Zn, Al and O precursors, respectively. When the metal precursors (i.e. TMA and DEZ) are co-injected in the deposition region, the Al/(Al+Zn) ratio can be accurately controlled.

SUMMARY

It is an objective of the invention to provide a method of depositing an atomic layer that at least partly meets one or more of the problems of known methods.

To this end, the invention provides a method of depositing an atomic layer on a substrate comprising supplying a precursor gas from a precursor-gas supply comprised in a drum; the drum being rotatable with respect to a sealing piece that receives gas from a gas source. One of the drum or sealing piece comprising one or more gas feed channels in fluid connection with the precursor-gas supply; the other of the drum or sealing piece comprises one or more circumferential grooves in its surface sealed by the one of the drum or sealing piece thereby preventing a fluid flowpath in radial direction and leaving a fluid flow path in circumferential direction. During supplying the precursor gas from the precursor-gas supply towards the substrate the gas feed channels abut the sealed grooves wherein a part of the gas flow path is formed by the sealed grooves. At least one sealed groove is provided with one or more separations separating adjacent zones of process gas feeds in the sealed groove, thus allowing zones to provide for mutually differing process gas compositions; and having the precursor gas react near, e.g. on, the substrate so as to form an atomic layer by rotating the drum along a rotation trajectory while supplying the precursor gas; thus depositing a stack of atomic layers of a gradient composition.

Accordingly a new design is provided where a precursor supply groove is divided into different zones. Each zone can individually be supplied by a predefined mixture or single concentration precursor. The zones are separated by a restriction that allows precursors from either side of the restriction to flow into the drum but prevents convective mixing between the zones. The deposition drum supplies precursors to the substrate where the precursor concentration(s) vary with the rotation angle of the drum.

In this way, a stack of atomic layers can be deposited while continuously moving (e.g. rotating or revolving) the precursor-gas supply and/or the substrate with a gradient composition profile by switching between supplying and interrupting the precursor gas.

In an embodiment, the deposition head may be rotated continuously in one direction, while supplying the precursor gas. Thus, moving the precursor-gas supply and/or the substrate in a reciprocating manner may be avoided when depositing the stack of atomic layers. In this way back-turning of the precursor head and/or the substrate, being inherent to reciprocating motion, can be prevented. This may lead to a higher deposition rate and/or a more even atomic layer deposition, e.g. because there is no seam at a turning point of the deposition head.

In another embodiment, the deposition head may be rotated in a reciprocating motion while supplying the precursor gas. E.g. the deposition head is first moved in one direction while supplying the precursor gas and then moved in another direction while supplying the precursor gas. An advantage of this embodiment may be a higher flexibility in the deposition process, e.g. less precursor gas supplies may be required.

The substrate may be a flexible substrate or a rigid, i.e. inflexible, substrate. Using a flexible substrate combines well with the rotating deposition head. Such a flexible substrate allows for bending the substrate which facilitates guiding the substrate around the rotating deposition head.

In an embodiment, the precursor-gas supply is shaped in elongated form along, or inclined to, an axial direction of the deposition head, wherein the precursor-gas supply and/or the substrate are moved in a direction that is transverse to the axial direction defined by the rotating head movement. Such an elongated precursor-gas supply formed along or inclined to the axial direction may enable a homogeneous deposition of the atomic layer on the substrate.

In an embodiment, the deposition head has an output face that at least partly faces the substrate during depositing the atomic layer, the output face being provided with the precursor-gas supply. Hence, the precursor-gas supply may extend, along a curved output face, in a direction along or inclined with the axis of rotation of the deposition head.

In an embodiment, the output face has a substantially rounded, typically a substantially cylindrical or conical, e.g. frustoconical, shape and/or frustum shape, defining a movement path of the substrate. Hence, the output face may have a substantially cylindrical, conical, or frustum shape. Such an output face combines well with a rotating precursor head, because it enables maintaining, in use, a rather constant separation distance between the precursor head and the substrate.

In an embodiment, the method comprises supplying a bearing gas between the deposition head and the substrate for forming a gas-bearing layer that separates the substrate and the deposition head. In this way, a rather narrow separation distance between the rotating deposition head and the substrate may be maintained. The separation distance may e.g. be at most 200 micrometers, at most 100 micrometers, at most 15 micrometers, or at most 10 micrometers, e.g. around 5 micrometers. At the same time, the separation distance may be at least 3 micrometers, at least 5 micrometers, or at least 10 micrometers. Such small separation distances decrease an amount of excess precursor gas that is provided towards the substrate. This may be worthwhile as the precursor gas usage may usually add to production costs.

In an embodiment, the method comprises having the precursor gas react near, e.g. on, the substrate so as to form the atomic layer by selectively treating the deposited precursor material by means of a laser. Such selective treating may comprise controlling the laser for selectively treating the deposited precursor material. Selectively controlling the laser may comprise selectively controlling an intensity of the laser, e.g. turning the laser on and off to provide a raster type patterning. In such an embodiment, a laser switching time in conjunction with a relative velocity defines a pixel grid which can define very small in-plane patterning structures of for example 50 micrometers, or even less. Alternatively, selectively controlling the laser may comprise selectively diverting a beam of the laser away from the deposited precursor material. In this way, a patterned atomic layer may be deposited. E.g., when a part of the substrate where, according to an intended pattern, an atomic layer is to be deposited is adjacent to the reactant-gas supply, the laser may be turned on. E.g., when a part of the substrate where, according to the intended pattern, an atomic layer is not to be deposited is adjacent to the reactant-gas supply, the laser may be turned off. Preferably, the laser is comprised by, e.g. integrated in, the deposition head.

In an embodiment, the method comprises supplying the bearing gas from a bearing-gas supply of the deposition head towards the substrate for providing the gas-bearing layer.

In an embodiment, the method comprises supplying the precursor gas by means of the precursor-gas supply in a cavity that is defined in the deposition head and is facing the substrate, and draining the precursor gas by means of a precursor-gas drain of the deposition head from the cavity for substantially preventing precursor gas to escape from the cavity, the method further comprising supplying the bearing gas by means of the bearing-gas supply at a distance from the cavity.

Such a cavity makes it possible to apply process conditions in the cavity that are different from process conditions in the gas-bearing layer. Preferably, the precursor-gas supply and/or the precursor-gas drain are positioned in the cavity. In the gas-bearing layer, i.e. near or adjacent to the bearing-gas supply, the separation distance may be at least 3 micrometers, at least 5 micrometers, at least 10 micrometers, and/or at most 15 micrometers. In the cavity the separation distance may be at most 500 micrometers, at most 200 micrometers, at most 100 micrometers, at most 50 micrometers, and/or at least 25 micrometers. Hence, the separation distance in the cavity may be in a range from 25 micrometers to at most 500 micrometers.

The inventor recognized that the features of this embodiment may be applied more broadly, optionally in combination with one or more of the other embodiments and/or features described herein. Accordingly there is provided a method of depositing an atomic layer, preferably a stack of atomic layers, on a substrate, which method comprises supplying a precursor gas from a precursor-gas supply, preferably a plurality of precursor-gas supplies, comprised by a deposition head towards the substrate, and further comprises realizing relative motion between the precursor-gas supply and the substrate, wherein the method comprises supplying the precursor gas by means of the precursor-gas supply in a cavity that is defined in the deposition head and is facing the substrate, and comprises draining the precursor gas by means of a precursor-gas drain of the deposition head from the cavity for substantially preventing precursor gas to escape from the cavity, the method further comprising supplying the bearing gas by means of the bearing-gas supply at a distance from the cavity.

Preferably, this method comprises having the precursor gas react near, e.g. on, the substrate so as to form the atomic layer. This method may be employed for manufacture of a photovoltaic panel or a part thereof. The atomic layer may be part of the photovoltaic panel or the part thereof. For example, the atomic layer may be part of a physical passivation layer, such as an aluminum oxide ($Al_2O_3$) layer. Alternatively, the atomic layer may be part of a layer that is different from a medium-k aluminum oxide ($Al_2O_3$) layer. For example, the atomic layer may be part of an antireflection layer, such as a silicon nitride ($Si_3N_4$) layer. The method may optionally include having the precursor gas react near, e.g. on, the substrate so as to form the atomic layer without exposing a monolayer of deposited precursor material to a plasma. Preferably, the precursor-gas supply and the precursor-gas drain are positioned in the cavity.

In an embodiment, the method is used for modifying a surface energy (e.g. hydrophobicity) of the substrate by means of the atomic layer. The method may e.g. be used for modifying the surface energy of a sheet of paper or a sheet of textile. The modification may be e.g. be followed by adding a layer on the substrate having the modified surface energy, e.g. by means of printing or photolithography. Such methods may benefit from a well-defined surface energy that may be enabled by atomic layer deposition.

In an embodiment, the method comprises draining the precursor gas through the precursor-gas drain of the deposition head.

In an embodiment, the output face is provided with the cavity, the precursor-gas drain and/or the bearing-gas supply.

Other advantageous embodiments of the apparatus and method are described in the dependent claims.

BRIEF DESCRIPTION OF THE DRAWINGS

The invention will now be described, in a non-limiting way, with reference to the accompanying drawings, in which:

FIG. 6 shows a planar view and cross sectional view of a circumferential groove.

Unless stated otherwise, like reference numerals refer to like elements throughout the drawings.

DETAILED DESCRIPTION OF EMBODIMENTS

Figure 1:
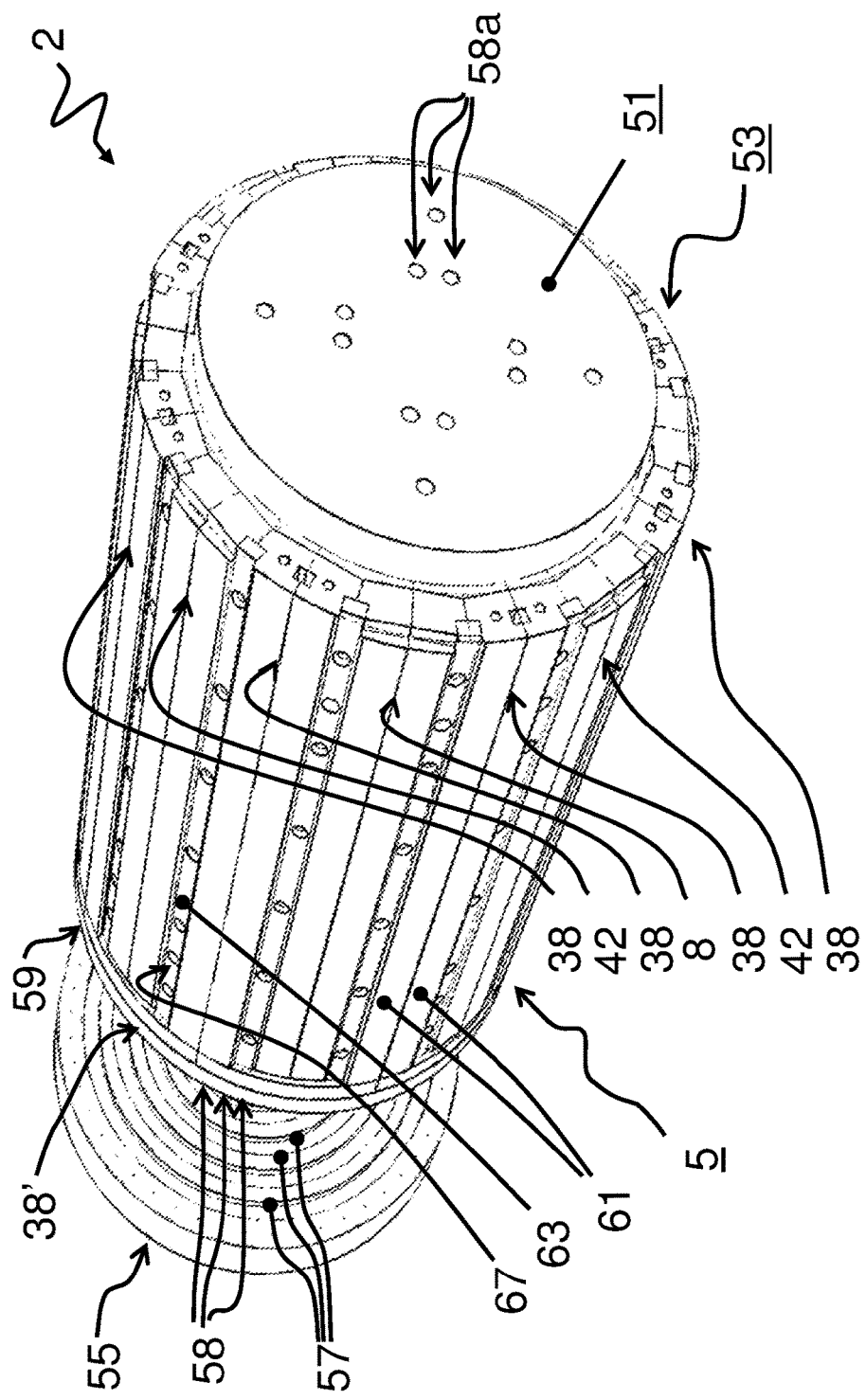
FIG. 1 shows an embodiment with yet another gas switching structure.

Atomic layer deposition is known as a method for depositing a monolayer of target material in at least two process steps, i.e. half-cycles. A first one of these self-limiting process steps comprises application of a precursor gas on the substrate surface. A second one of these self-limiting process steps comprises reaction of the precursor material in order to form the monolayer of target material on a substrate. The precursor gas can for example contain metal halide vapours, such as hafnium tetra chloride ($HfCl_4$), but can alternatively also contain another type of precursor material such as metalorganic vapours, for example tetrakis-(ethyl-methyl-amino) hafnium or trimethylaluminium ($Al(CH_3)_3$). The precursor gas can be injected together with a carrier gas, such as nitrogen gas, argon gas or hydrogen gas or mixtures thereof. A concentration of the precursor gas in the carrier gas may typically be in a range from 0.01 to 1 volume %, but can also be outside that range.

Reaction of the precursor gas may be carried out in a number of ways. First, a monolayer of deposited precursor material can be exposed to a plasma. Such plasma-enhanced atomic layer deposition is especially suitable for deposition of medium-k aluminum oxide ($Al_2O_3$) layers of high quality, for example for manufacturing semiconductor products such as chips and solar cells. Thus, the invention may e.g. be used for manufacturing solar cells, in particular for manufacturing flexible solar cells, by depositing one or more layers of a solar cell. Second, a reactant gas can be supplied towards the deposited monolayer of deposited precursor material. The reactant gas contains for example an oxidizing agent such as oxygen ($O_2$), ozone ($O_3$), and/or water ($H_2O$). Nitriding agents such as $N_2$, $NH_3$, etc. can be used alternatively to form nitrides such as silicon nitride ($Si_3N_4$). It is noted that the reactant gas may also be considered as a (second) precursor gas, e.g. two or more precursor gasses may react with each other to form an atomic layer as a reaction product.

In an example of a process of atomic layer deposition, various stages can be identified. In a first stage, the substrate surface is exposed to the precursor gas, for example hafnium tetrachloride. Deposition of the precursor gas is automatically terminated upon saturation of the substrate surface with a monolayer of by a single layer of chemisorbed precursor gas molecules. This self-limitation is a characteristic feature of the method of atomic layer deposition. In a second stage, excess precursor gas is purged using a purge gas and/or a vacuum. In this way, excess precursor molecules can be removed. The purge gas is preferably inert with respect to the precursor gas. In a third stage, the precursor molecules are exposed to a plasma or to a reactant gas, for example an oxidant, such as water vapor ($H_2O$). By reaction of functional ligands of the reactant with the remaining functional ligands of the chemisorbed precursor molecules, the atomic layer can be formed, for example hafnium oxide ($HfO_2$). In a fourth stage, excess reactant molecules are removed by purging. In addition, additional reactant stimulation systems may be used, for example, thermal, photonic or plasma excitation.

A few general requirements for a gas supply system onto a rotating spatial reel-to-reel (R2R) atomic layer deposition (ALD) system may be that if the gas supply originates from a stationary feed assembly, for a moving, i.e. rotating, spatial ALD system, a gas feed-through design is needed to feeding the gas from the stationary feed assembly to the rotating ALD system. Such feed-through should not generate particles that would inevitably contaminate the ALD process, resulting in, e.g., the creation of pinholes in deposited barrier layers. Thus preferably the two vapor supplies (e.g. a precursor gas TMA and a reactant gas $H_2O$) are completely separated throughout the entire gas circuit systems of the R2R equipment.

The translational velocity of the substrate may e.g. be approximately 0.1 m/s. For all embodiments presented herein, the precursor head may rotate with a frequency of 0.1 or 1 revolution per second. The precursor head may rotate with a frequency of e.g. approximately 30 revolutions per second. The translational velocity of the precursor-gas supply may e.g. be approximately 1 m/s. Furthermore, as the precursor-gas supply in use rotates, the precursor-gas supply can move in a continuous fashion in the same direction along one and the same part of the substrate 4 a plurality of times. In this way, a plurality of atomic layers can be deposited on the substrate. In this way one relatively thick composite layer can be obtained that comprises a plurality of atomic layers that may mutually overlap. Hence, more in general, the precursor-gas supply may rotate continuously in the same direction, along one and the same part of the substrate a plurality of times, for obtaining a composite layer that comprises a plurality of atomic layers that mutually overlap. Hence, it may be clear that terms like 'rotate(s)' and 'rotating' used herein may mean e.g. 'revolve(s)', respectively, 'revolving', 'gyrate(s)', respectively, 'gyrating', or 'spin(s)', respectively, 'spinning'. Hence, an apparatus according to the invention may be arranged for rotating the precursor-gas supply continuously in the same direction, along one and the same part of the substrate a plurality of times, for obtaining a composite layer that comprises a plurality of atomic layers that mutually overlap.

The term "circumferential grooves" as used herein refers to the fact that the grooves follow a circular path e.g. with a fixed radius that at least partly follows a rotation of a gas inlet or outlet in the drum. The grooves may be semi-circumferential e.g. be interrupted along the circumferential trajectory.

FIG. 1 shows an exploded view of an apparatus 2 wherein the gas supplies 8, 38, and 42 are comprised in a drum 5 that receives gas from a gas source (not shown here) via a sealing piece 55 that seals at least part of the drum's surface. In the current view only one sealing piece 55 is depicted to show the gas inlets 58a in the inner drum 51 on the front side.

In use, the sealing piece 55 will be kept pressed sealingly against the drum 5 to seal the grooves 57 between the sealing piece and the drum surfaces thus forming gas flow channels. The sealing piece 55 and the drum 5 thus form a sealing structure comprising the gas flow channels. The drum 5 is rotatable with respect to the sealing piece 55 and comprises one or more gas inlets 58. The sealed grooves 57 are arranged such that they abut the gas inlets 58 over a first part of the rotation trajectory thus forming a part of the gas flow path. In particular the grooves are connected to a gas outlet (not shown) that provides gas flow from the gas source through a channel formed by the sealed grooves. On positions where the grooves 57 abut the gas inlets 58, the gas may flow from the gas outlets of the sealing piece via the sealed grooves into the gas inlets of the drum. Alternatively, the grooves may be on an axial side of the drum, e.g. in a surface of a seal plate held sealingly to a side of the drum.

Another aspect illustrated by the current FIG. 1 is a preferred layout of the gas supplies 8, 38, 42 in the drum 5. In particular, precursor gas supplies 8 are preferably alternated with reactant gas supplies 42 separated by purge gas supplies 38. The deposition heads of the respective gas supplies 8, 38, 42 are slit-shaped, e.g. with a width of 0.1 mm. Through the slit-shaped deposition heads of the gas supplies 8, 38, 42 gasses may flow in a controlled fashion to a substrate (not shown) that may cover part of the drum's surface. The said narrow slit may be formed between exchangeable insert halves 61 that are connected to the drum with recessed connection pieces 63. The insert halves 61 form an outer part 53 of the drum comprising the deposition heads of the gas supplies.

A typical outlet gap formed by the insert halves 61 is 0.1 mm in width. A typical insert length is 250 mm for the precursor outlets and 280 mm for the $N_2$ inserts. The outer surface of the insert strips is preferably smooth to ensure an equal gas distribution over the insert length. The pneumatic restriction of the outlet gap is preferably much higher than the resistance of the divider chamber to obtain a homogeneous flow rate towards de reactant/bearing zone. A homogeneous flow rate is preferred to obtain a homogeneous bearing of the web/homogeneous deposition of precursor gasses.

The combination of a suction force of the drains 67 in the recessed channels formed by the connection pieces 63 and a pressure provided by the purge and other gas supplies may be balanced to keep a substrate (not shown) at a desired distance from the drum during deposition of the atomic layers on the substrate. The purge gas supplies may thus function both as a gas curtain between the precursor and reactant gasses as well as a gas bearing for the substrate. The precursor and/or reactant gas can also have a bearing function. Preferably also a circumferential purge gas supply 38' is provided with purge gas to prevent an undesired leakage of precursor and/or reactant gasses. In addition, as will be shown with more detail in FIG. 2, the grooves 57 may be arranged such that a gas supply to the drum is interrupted or redirected when the said gas supply traverses a part of the rotational trajectory where the drum surface is not covered by the substrate.

Figure 2:
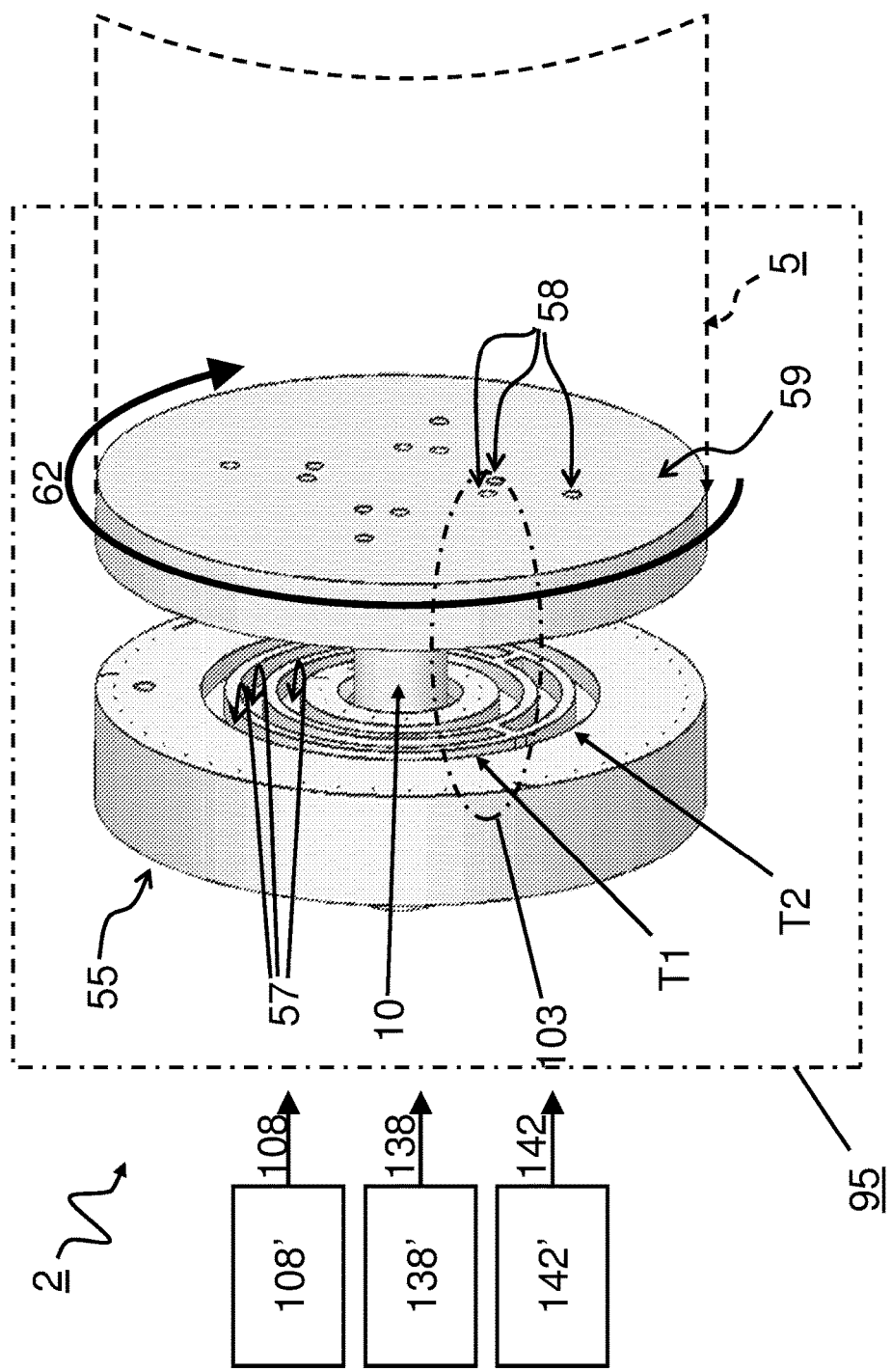
FIG. 2 shows a detail of the gas switching structure of FIG. 1.

FIG. 2 shows an exploded view of a sealing structure 95 formed by a sealing piece 55 that is to be connected to a rotatable feed through plate 59 of a drum 55. It is noted that the sealing structure may act as both a gas transition structure for providing gas from stationary sources 108', 138', 142' to the rotating drum 5 as well as a gas switching structure for interrupting and resuming the gas flow. The sealing piece 55 comprises circumferential grooves 57 that abut corresponding gas inlets/outlets in the feed-through plate 59. The grooves 57 in combination with the gas inlets/outlets 58 may form a valve 103 that opens as a function of a relative rotation of the drum 5 with respect to the sealing piece 55. The drum may rotate around an axle 10 that may rest on a bearing structure that may be formed e.g. by an inner cavity of the sealing piece 55 or externally. The axle 10 may be driven e.g. by a motor (not shown), preferably a heat resistant motor (e.g. brushless DC motor). The motor may connect directly to the drum axle 10 or e.g. via a gear box to increase torque of the motor It is noted that the substrate 4 does not cover the entire surface of the drum 5. Over the first part T1 of the rotation trajectory the substrate 4 may be in proximity to the output face of the drum 5 for depositing the atomic layer while over the second part T2 of the rotation trajectory the substrate is removed or away from the output face. Thus the said switching may prevent leakage of the precursor gas over the second part T2 of the rotational trajectory. Such leakage may otherwise e.g. result in an undesired reaction of the precursor outside of the designated areas on the substrate.

In use, the grooves 57 run between the surfaces of the sealing piece 55 and the rotating feed-through plate 59 comprised in the drum 5. The grooves 57 corresponding to a first part T1 of the rotational trajectory 62 of the drum may be provided with precursor gas 108, purge gas 138, and reactant gas 142 from respective gas sources 108', 138', and 142'. In addition, the grooves corresponding to a second part T2 of the rotational trajectory 62 of the drum may be connected to gas drains (not shown). In such an arrangement, when the gas inlets/outlets 58 are opposite the grooves connected to the gas sources 108', 138', or 142', the gas supplies of the drums may supply the respective gasses to a surface of the substrate (not shown), during the first part of the rotational trajectory T1 when the output face of the drum is in proximity to the substrate. In addition, when the substrate is away from the drum's surface, the gas supplies of that part of the surface of the drum 5 may be interrupted and/or the gasses may be drained to prevent an undesired leakage of the precursor and/or reactant gasses to an external environment.

Accordingly, in the shown embodiment, the circumferential sealed grooves 57 extend along the first part T1 of the rotation trajectory 62, ending between the first and second parts T1 and T2 of the rotation trajectory 62 in such a way that during interrupting supplying the precursor gas from said precursor-gas supply over the second part T2 of the rotation trajectory, the gas flow path that runs via the grooves 57 is interrupted by a surface of the drum, in particular the feed-through plate 59 in this case.

Alternative to the shown embodiment, the grooves may be provided in the drum 5 and gas inlets/outlets in the sealing piece 55. Also, while the currently shown sealing piece 55 comprises a plate that seals a side of the drum, alternatively, the sealing piece may seal a circumference of the drum wherein the grooves are provided along the circumference of either the drums surface of the sealing piece. Also combinations of these side-sealing and circumferential sealing pieces are possible. Furthermore also the drum 5 and sealing piece 55 may both comprise grooves or a combination of exhaust channels and grooves. Furthermore, while in the current embodiment, the grooves are shown as having a certain depth, this depth may also be varied along the groove length.

While in the current embodiment only three grooves are shown, this number may be expanded or reduced to fit the particular needs of the deposition process. In an advantageous embodiment, grooves carrying precursor gasses are surrounded by grooves carrying purge gas at a higher pressure than that of the precursor gasses. In this way the purge gas may form a gas curtain between the precursor gas and the external surroundings. Alternatively or in addition, grooves may be provided with alternating precursor gas 108 and reactant gas 142 supplies separated by grooves with purge gas 142 supplies and gas drains, e.g. in a sequence from the center outward: precursor gas supply, gas drain, purge gas supply, gas drain, reactant gas supply, gas drain, purge gas supply. In this way the precursor gas together with the purge gas is drained in a separate drain channel from the reactant gas with the purge gas.

Alternatively or in addition, precursor gasses may be supplied through a sealing piece on one side of the drum while reactant gasses are supplied on another side of the drum. One or both sides may be provided with purge gas curtains to prevent the undesired escape of precursor/reactant gasses to an external surroundings. The sealing piece 55 can also have a gas bearing to the (axial) drum side.

Figure 3:
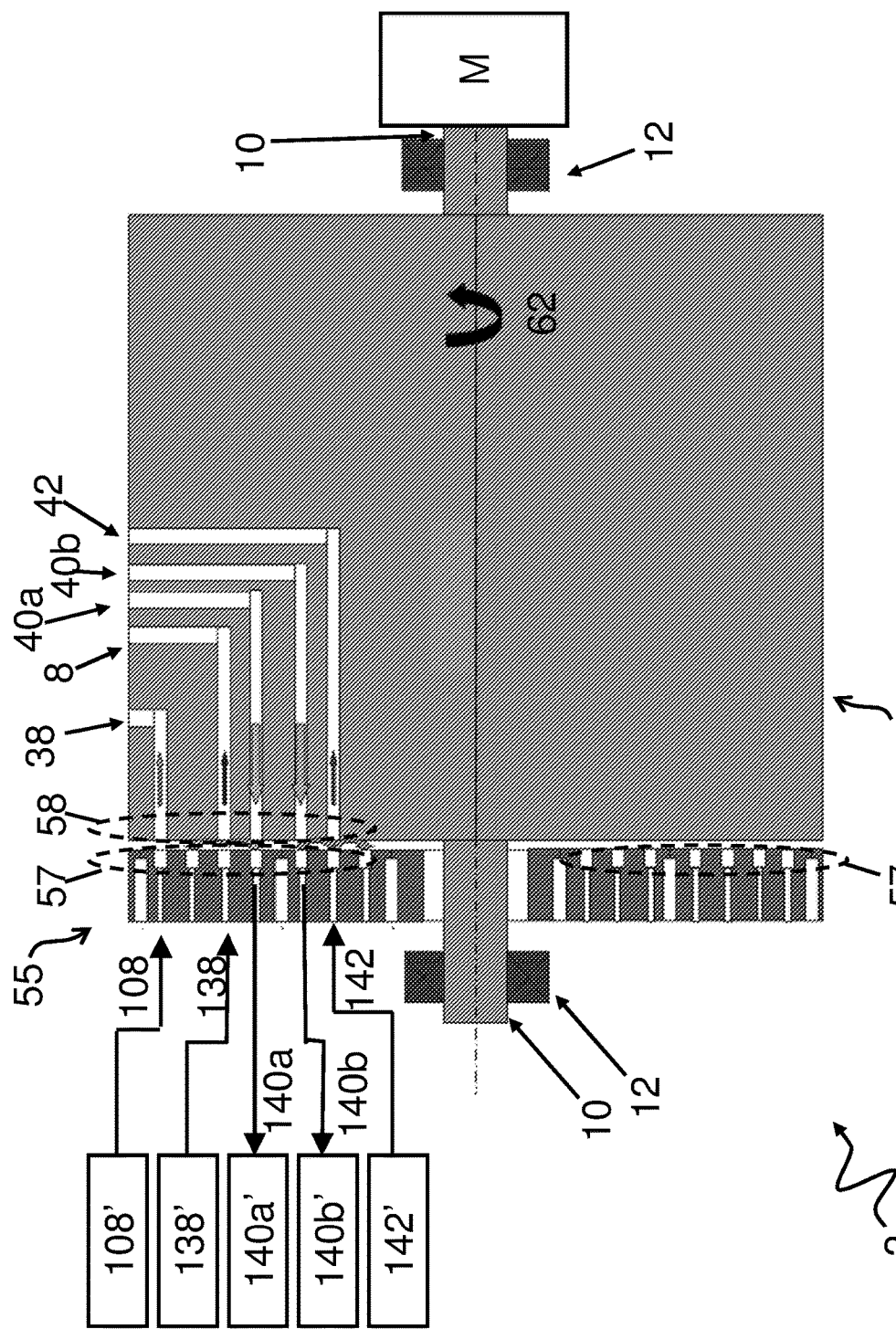
FIG. 3 shows an embodiment of the gas switching structure of FIG. 1.

FIG. 3 shows a schematic cross section gas connections between a sealing piece 55 to a drum 5. The drum 5 is rotatable with respect to the sealing piece 55 over a rotational trajectory 62, driven e.g. by a motor M via an axle 10 that rotates in bearings 12.

The drum comprises precursor gas supplies 8 (e.g. TMA), purge gas supplies 38 (e.g. $N_2$), reactant gas supplies 42 (e.g. water vapor) and gas drains 40a and 40b on an output face of the drum 5. The gas supplies 8, 38, 42 receive gas 108, 138, 142 from respective gas sources 108', 138', 142' via a sealing piece 55 that seals at least part of the drum's surface. Thereto the drum 5 comprises gas outlets/inlets 58 while the sealing piece 55 comprises circumferential grooves 57 in its surface. In other words the grooves 58 follow a tangential path with a radius (distance to the center) corresponding to that of the inlets/outlets 58. In an embodiment, the purge gas lines may be designed in axial direction for gas bearing and separation of the reactant gases, as well in radial direction for bearing the drum extremes.

The grooves 57 are sealed by the drum 5 and arranged such that they abut the gas outlets/inlets 58 over at least a part of the rotation trajectory 62. In use, a part of the sealed grooves 57 may form part of a gas flow path between the gas sources 108', 138', 142' and the gas supplies 8, 38, 42. Furthermore, other sealed grooves 57 or another part of the sealed grooves 57 may form part of another gas flow path between the gas drains 40a, 40b and the respective gas sinks 140a', 140b' for draining excess precursor gas 8 and reactant gas 42, respectively. Preferably the drain channels for precursor gas 108 and reactant gas 142 are kept separate such that no undesired reaction occurs between the precursor gas and the reactant gas at non-designated areas (i.e. not on the substrate). As was discussed above, alternative to the shown embodiment, the grooves 57 and gas inlets/outlets 58 may be reversed between the sealing piece 55 and the drum 5 or be mixed in any combination.

In an embodiment the circumferential sealed grooves extend along a first part of the rotation trajectory 62, ending between the first and a second part of the rotation trajectory 62 in such a way that during interrupting supplying the precursor gas from the precursor-gas supply 8 over the second part of the rotation trajectory 62, the gas flow path is interrupted by a surface of the drum 5. In this way the relative rotation of the drum with respect to the sealing piece opens and closes a gas flow path between the gas sources/sinks and the respective gas supplies/drains, i.e. the combined structure acts as a valve system.

The gas feed-through plates or sealing piece 55, may have several functions:
  Connect to the nitrogen inserts and create a nitrogen slit in circumferential direction
  Serve as an axle to bear the drum in conventional or air bearings
  Provide a larger diameter at the outer edge to fit a feed-through plate e.g. with a typical diameter of 220 mm.
  Provide the holes to feed gases through.
  Serve as an axial (gas) bearing for the drum.

Each chamber/insert is preferably connected with a single radial bore. The outlet chambers may have two bores each. The axial bores serve to connect to the feed-through plate. The bores may e.g. have a diameter of typically 6 mm. The radial bores can be e.g. at a distance close to the extreme sides of the drum to minimize the channel volumes and dead space.

In an embodiment, the drum 5 can be carried by standard air bushings of porous carbon, and be fixed in axial direction by a flat round air bearing. The drum can be driven by a heat resistant motor M (e.g. brushless DC motor) that connects directly to the drum axle 10 with a gearbox in between to increase torque of the motor.

Figure 4:
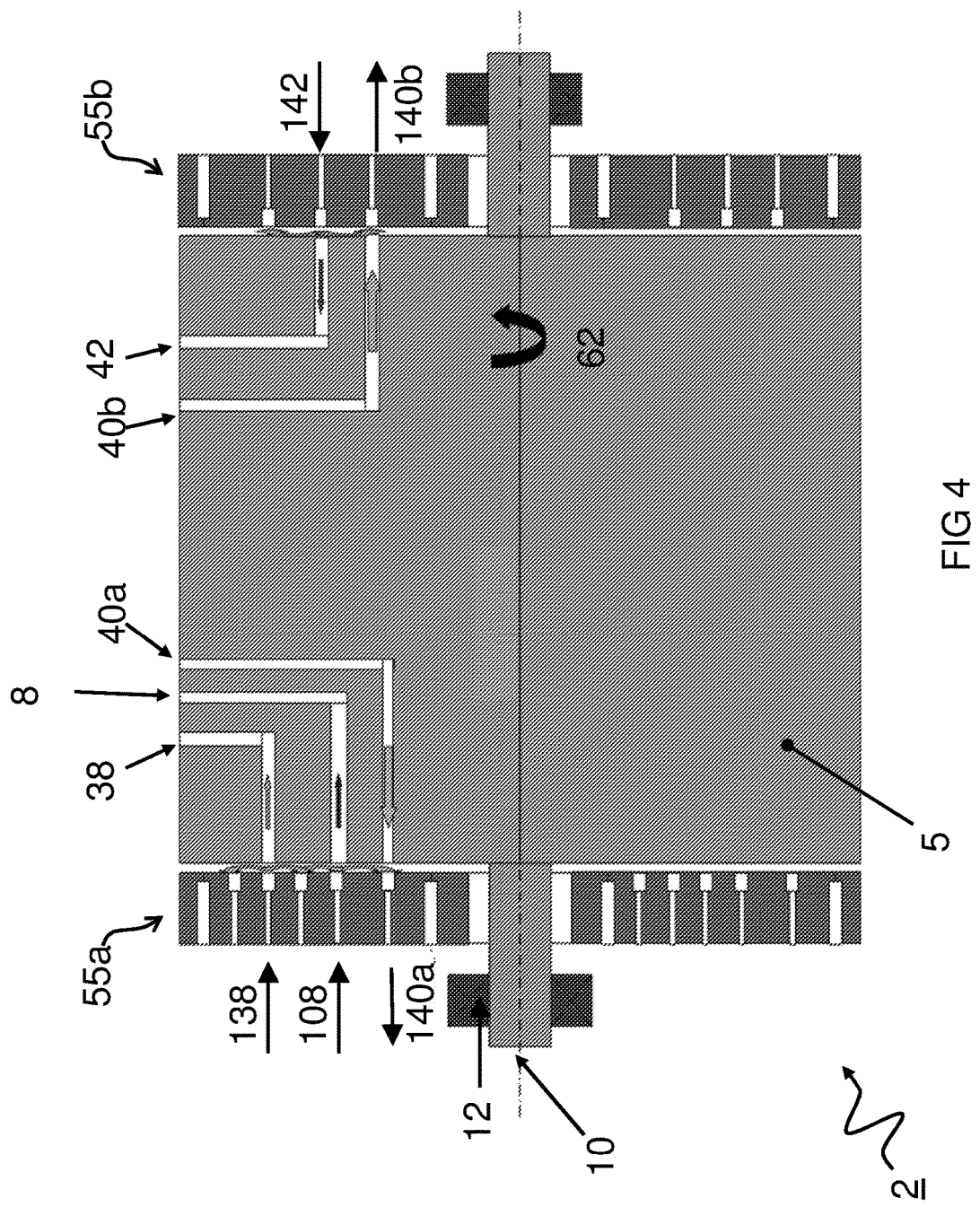
FIG. 4 shows another embodiment of the gas switching structure of FIG. 1.

FIG. 4 shows another embodiment of the apparatus 2. The current embodiment of the apparatus 2 comprises two sealing pieces 55a, 55b on either side of the drum 5. The drum is rotatable with respect to the sealing pieces 55a, 55b over a rotational path 62, e.g. rotating around an axle 10 that runs in a bearing 12. The first sealing piece 55a is arranged for supplying precursor gas 108 and purge gas 138 to the drum 5 as well as draining excess purge and/or precursor gas 140a from drain 40b in the drum. The second sealing piece 55b is arranged for supplying reactant gas 142 to the drum 5 as well as draining excess reactant gas 140b from drain 40a in the drum 5. An advantage of supplying and/or draining the precursor gas 108 and the reactant gas 142 via two separate sealing pieces 55a and 55b, respectively, is that the two gasses 108 and 142 will be prevented from meeting each other e.g. via leaky openings in the sealing piece and reacting at places outside the designated areas. Another advantage may be a smaller spatial claim in the drum design.

Figure 5:
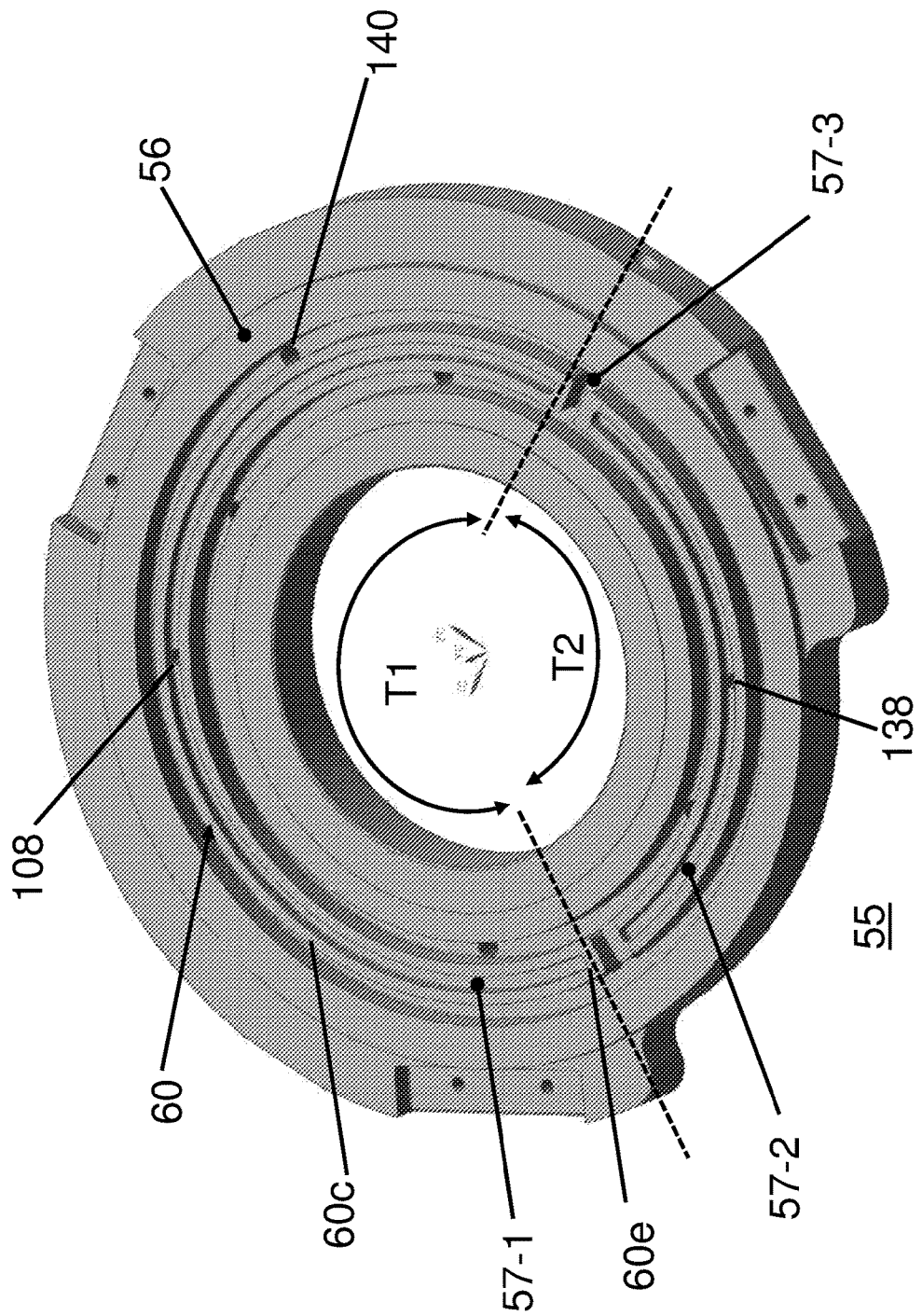
FIG. 5 shows a plan view of the layout of a sealing piece.

FIG. 5 shows a plan view of the layout of the sealing piece 55 of the previous type. A first circumferential sealed groove 57-1 e.g. for feeding process gas, for example, a precursor, through channels 108 is defined by a wall 60 upstanding from a suction bed 57-3 formed in a planar face 56 that e.g. forms a restriction face for a corresponding air bearing. The upstanding wall 60 has a part 60c circumferentially extending along a first part T1 of the rotation trajectory ending with an upstanding wall part 60e. The upstanding wall part 60c aligns with a corresponding feed channel 58 (see previous figures) in the drum, that closes the flowpath in radial direction but leaves a flow path in circumferential, i.e. tangential direction. Similarly, second circumferential sealed groove 57-2 extends along second part of the rotation trajectory T2 in such a way that during interrupting supplying the precursor gas from the precursor-gas supply 8 over the second part of the rotation trajectory 62, the gas flow path is interrupted and may be purged through purge channels 138. In the disclosed sealing piece 55, the groove parts and suction beds have corresponding channels 108, 138, 140 to drain or feed respective process gases. In crossing the endpart 60e, a corresponding feed channel 58 is shut off from the groove 57-1, and travels, after crossing suction bed part 57-3, over the purge groove 57-2 thus interrupting the precursor gas feed. Suction bed 57-3 is thereby able to drain possible flow from the feed groove 57-1 and/or purge groove 57-2.

FIG. 6 shows a planar view FIG. 6a and cross sectional view FIG. 6b of a circumferential groove 600 that extends across the entire circumference of a sealing piece 550. In an alternative not depicted, groove 571 may have a corresponding end wall structure in order to provide for a partially circumferential groove with end wall 60e similar to groove 57-1 as disclosed in FIG. 5. The supply groove 600 in FIG.

6 provides for a modification so that gradient films can be deposited either by varying the TMA flow to the reactor or the exposure time of the substrate to the precursors. Indeed, while the arrangement of FIG. 5 is effective in controlled feeding and interrupting of process gases by the end wall arrangement 60e, in FIG. 6, circumferential groove 571 is provided with zones 571-1 . . . 4 that are formed by zone separations 600 extending radially in the groove 571. The separations 500 be placed at similar or varying lengths to provide zones of a suitable circumference in the groove 57-1. In the zones may mutually differing compositions and mixtures of process gases can be fed. These separation walls 600 are preferably slightly recessed relative to the planar face 56 forming a flow restriction in order to provide a controlled cross flow between the zones occurs so as to prevent interruption of the precursor flow. In addition the wall thickness of a separation 61 is preferably smaller than a corresponding feed channel 58. The separations are characterized by adjacent zones of process gas feeds, that allow for differing process gas compositions, In an example, Indium Zinc oxide (IZO) can be made by premixing an indium and a zinc precursor for the first half reaction and using water for the second half reaction. By changing the concentrations of the In an Zn precursors during deposition, the elemental In/Zn ratio in the film will also vary leading to a gradient film. Another example is when depositing zinc oxide (ZnO). Only a single Zn precursor is used, but by varying the Zn-precursor concentration during deposition, the electrical properties change leading to a gradient in electrical properties. So to obtain a gradient film with spatial ALD, the precursor concentrations need to be varied during deposition.

When the drum 5 rotates, an individual slot feed channel 58 moves with relative speed V over the supply groove 571. Before the hole 58 moves over the restriction, it is in contact with a zone 571-1 supplying precursor(s) with concentration ci, after it passed the restriction it is in contact with a zone 571-2 supplying precursor(s) with a concentration ci+1.

Separation 600 prevents flow of precursors from one zone to the other by flow restriction. However a gap is left between the separation 600 and face of drum 5 where mixing can occur. As all zones 571-1 . . . 4 will be at approximately the same pressure, convective flow or mixing can be prevented between the zones 571-1 . . . 4 and the only way of mixing will be by diffusion and drag. The resulting mixing area will be small and only near the separation 600. Slight mixing can be beneficial for allowing a continuous transition in concentration profiles between subsequent zones 571-1 . . . 4 and can be optimized in shape and dimensions for this purpose.

Each zone 571-1 . . . 4 can be individually supplied by a single or a mixture of precursors, where each zone is connected by a dedicated precursor evaporator (not shown). Also, a single precursor evaporator can be used feeding a main line that splits up in several secondary lines feeding the zones. In both cases, the flows and concentrations can be either mass-flow controlled or pressure controlled, as long as the pressure in the different zones is approximately the same.

The application fields for the present disclosure are not limited to ALD but may extend e.g. for reel-to-reel deposition equipment for large area manufacturing of barrier layers for OLED, organic photo-voltaics, flexible organic electronics (e.g. transistors), passivation and buffer layers thin-film solar cells, moist and oxygen diffusion barrier layers in (food) packaging, etc. and is not limited to the production of $Al_2O_3$ alone. The deposition of other materials (ZnO, etc.), is also envisaged.

Equally all kinematic inversions are considered inherently disclosed and to be within the scope of the present invention. The use of expressions like: "preferably", "in particular", "especially", "typically" etc. is not intended to limit the invention. The indefinite article "a" or "an" does not exclude a plurality. Features which are not specifically or explicitly described or claimed may be additionally comprised in the structure according to the present invention without deviating from its scope. For example, the deposition head may be provided with a heater for realizing an elevated temperature, for example near 220° C., of a part of the substrate during atomic layer deposition on that part of the substrate. As another example, the apparatus may be provided with a pressure controller for controlling gas pressure in the cavity, in the precursor-gas supply, the precursor-gas drain, the reactant-gas supply, the reactant-gas drain, the bearing-gas supply, and/or the precursor-gas drain. The pressure controller may comprise the gas controller. Furthermore, the apparatus may e.g. comprise a micro-plasma source or another source suitable for enhancing the reactivity of the precursor-gas material during deposition on the substrate or for post-deposition treatment after deposition on the substrate. It may be clear that, in addition to or alternative to rotating the deposition head, reciprocating the deposition head may provide valuable deposition options.

The invention claimed is:

1. A method of depositing an atomic layer on a substrate, the method comprising:
    supplying a precursor gas from a precursor-gas supply comprised in a drum; the drum being rotatable with respect to a sealing piece that receives gas from a gas source, wherein one of the drum and sealing piece comprises one or more gas feed channels in fluid connection with the precursor-gas supply, wherein the other of the drum and sealing piece comprises one or more circumferential grooves in its surface sealed by the one of the drum and sealing piece thereby preventing a fluid flowpath in a radial direction and leaving a fluid flow path in a circumferential direction, wherein during the supplying the precursor gas from the precursor-gas supply towards the substrate, the gas feed channels abut the sealed grooves, wherein a part of the gas flow path is formed by the sealed grooves, and wherein at least one sealed groove is provided with one or more separations separating adjacent zones of process gas feeds in the sealed groove, thus allowing zones to provide for mutually differing process gas compositions; and
    providing a relative motion between the precursor-gas supply and the substrate to have the precursor gas react on the substrate so as to form an atomic layer by rotating the drum along a rotation trajectory while supplying the precursor gas; thus depositing a stack of atomic layers of a gradient composition,
    wherein the at least one groove is formed by an upstanding wall that is sealed by an abutting face of one of the sealing piece or the drum, and
    wherein the separations are recessed relative to the upstanding wall thereby forming a flow restriction relative the abutting face in order to provide a controlled cross flow between adjacent zones.

2. The method according to claim 1, wherein the separations are provided with a wall thickness that is smaller than a corresponding feed channel diameter in order to provide a controlled cross flow between adjacent zones.

3. The method according to claim 2, wherein the gas supply is comprised in drum that receives gas from a stationary gas source via a gas flow path comprising relative rotating parts; wherein a leakage of the precursor gas through an opening between the relative moving parts is prevented by a purge gas provided around said opening having a higher pressure than the precursor gas.

4. The method according to claim 1, further comprising switching between:
supplying the precursor gas from the precursor-gas supply towards the substrate over a first part of the rotation trajectory; and
interrupting supplying the precursor gas from said precursor-gas supply over a second part of the rotation trajectory.

5. The method according to claim 4, wherein
over the first part of the rotation trajectory the substrate is in proximity to an output face, which is supplying the precursor gas, for the depositing the atomic layer,
over the second part of the rotation trajectory the substrate is removed or away from the output face; and
said interrupting is provided by redirecting or switching off a precursor gas flow through the precursor gas supply to prevent a leakage of the precursor gas over the second part of the rotation trajectory.

6. The method according to claim 4, wherein the circumferential sealed grooves extend along the first part of the rotation trajectory, ending between the first and second part of the rotation trajectory in such a way that during interrupting supplying the precursor gas from said precursor-gas supply over the second part of the rotation trajectory, the gas flow path is interrupted by a surface of the other of the drum and sealing piece.

7. An apparatus for depositing an atomic layer on a substrate, the apparatus comprising:
a drum comprising a deposition head and a sealing piece that seals at least part of the drum's surface;
wherein the drum is rotatable with respect to the sealing piece that receives gas from a gas source,
wherein one of the drum and sealing piece comprises one or more gas feed channels in fluid connection with the precursor-gas supply,
wherein the other of the drum and sealing piece comprising one or more circumferential grooves in its surface sealed by the one of the drum and sealing piece thereby preventing a fluid flowpath in a radial direction and leaving a fluid flow path in a circumferential direction,
wherein in use, during the supplying the precursor gas from the precursor-gas supply towards the substrate the gas feed channels abut the sealed grooves wherein a part of the gas flow path is formed by the sealed grooves;
wherein at least one sealed groove is provided with one or more separations separating adjacent zones of process gas feeds in the sealed groove, thus allowing zones to provide for mutually differing process gas compositions;
wherein the deposition head is constructed for realizing a relative motion between the precursor-gas supply and the substrate to have the supplied precursor gas react on the substrate so as to form an atomic layer by rotating the drum along a rotation trajectory while supplying the precursor gas; thus depositing a stack of atomic layers of a gradient composition,
wherein the at least one groove is formed by an upstanding wall that is sealed by an abutting face of one of the sealing piece or the drum, and
wherein the separations are recessed relative to the upstanding wall thereby forming a flow restriction relative the abutting face to provide a controlled cross flow between adjacent zones.

8. The apparatus according to claim 7, wherein the separations are provided with a wall thickness that is smaller than a corresponding feed channel diameter thereby forming a flow restriction in order to provide a controlled cross flow between adjacent zones.

9. The apparatus according to claim 7, further comprising a gas switching structure arranged and constructed for switching between:
supplying the precursor gas from the precursor-gas supply towards the substrate over a first part of the rotation trajectory; and
interrupting supplying the precursor gas from said precursor-gas supply over a second part of the rotation trajectory.

10. The apparatus according to claim 9, wherein the circumferential sealed grooves extend along the first part of the rotation trajectory comprising an end wall, ending the groove between the first and second part of the rotation trajectory by an end wall in such a way that during interrupting supplying the precursor gas from said precursor-gas supply over the second part of the rotation trajectory, the gas flow path is interrupted by a surface of the other of the drum and sealing piece.

11. The apparatus according to claim 7, wherein the circumferential sealed grooves extend along end faces of the rotatable drum.

* * * * *